US010304737B2

(12) United States Patent
Ono et al.

(10) Patent No.: US 10,304,737 B2
(45) Date of Patent: May 28, 2019

(54) METHOD OF MANUFACTURING SEMICONDUCTOR DEVICE

(71) Applicant: Toshiba Memory Corporation, Minato-ku (JP)

(72) Inventors: Takanobu Ono, Kuwana (JP); Tsutomu Fujita, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/704,748

(22) Filed: Sep. 14, 2017

(65) Prior Publication Data
US 2018/0277436 A1    Sep. 27, 2018

(30) Foreign Application Priority Data

Mar. 23, 2017    (JP) .................................. 2017-058147

(51) Int. Cl.
| H01L 21/78 | (2006.01) |
| H01L 23/544 | (2006.01) |
| H01L 21/268 | (2006.01) |
| H01L 21/683 | (2006.01) |
| H01L 21/304 | (2006.01) |
| H01L 23/00 | (2006.01) |

(52) U.S. Cl.
CPC ............ *H01L 21/78* (2013.01); *H01L 21/268* (2013.01); *H01L 21/304* (2013.01); *H01L 21/6836* (2013.01); *H01L 23/544* (2013.01); *H01L 23/562* (2013.01); *H01L 2221/68336* (2013.01); *H01L 2223/5446* (2013.01); *H01L 2223/54426* (2013.01)

(58) Field of Classification Search
CPC ... H01L 21/78; H01L 21/304; H01L 21/6836; H01L 21/268; H01L 23/544; H01L 2221/68336; H01L 2223/5446
See application file for complete search history.

(56) References Cited

U.S. PATENT DOCUMENTS

| 2007/0111390 | A1* | 5/2007 | Komura ............ B23K 26/0057 438/113 |
| 2009/0203193 | A1 | 8/2009 | Morikazu et al. |
| 2014/0099777 | A1 | 4/2014 | Mackh et al. |
| 2015/0371970 | A1 | 12/2015 | Sakurada |

FOREIGN PATENT DOCUMENTS

| JP | 2006-140356 | 6/2006 |
| JP | 2009-184002 | 8/2009 |
| JP | 2010-3817 | 1/2010 |
| JP | 2013-135198 | 7/2013 |
| JP | 2014-078556 A | 5/2014 |
| TW | 200703496 A | 1/2007 |
| WO | WO 2014/054451 A1 | 4/2014 |

* cited by examiner

*Primary Examiner* — Kyoung Lee
(74) *Attorney, Agent, or Firm* — Oblon, McClelland, Maier & Neustadt, L.L.P.

(57) ABSTRACT

According to an embodiment, a method of manufacturing a semiconductor device includes forming a first modified zone in a wafer by irradiating the wafer with a laser having transmissivity with respect to the wafer along a part of a dicing line on the wafer, and forming a second modified zone in the wafer by irradiating the wafer with the laser along the dicing line on the wafer. The first modified zone is partially formed between a surface of the wafer and the second modified zone, a semiconductor interconnect layer being formed on the surface of the wafer.

13 Claims, 15 Drawing Sheets

METHOD OF MANUFACTURING SEMICONDUCTOR DEVICE

CROSS-REFERENCE TO RELATED APPLICATIONS

This application is based upon and claims the benefit of priority from Japanese Patent Application No. 2017-058147, filed on Mar. 23, 2017; the entire contents of which are incorporated herein by reference.

FIELD

Embodiments of the invention relate generally to a method of manufacturing a semiconductor device.

BACKGROUND

A dicing technique has been proposed in which a laser is condensed inside a wafer along the outer shape of a semiconductor element to form a modified zone and a cleavage surface due to thermal expansion on the side surface of the semiconductor element and then the wafer is divided and fragmented by grinding the wafer from the back surface. In a method of manufacturing a semiconductor device using such a dicing technique, it is required to suppress occurrence of cracks.

DETAILED DESCRIPTION

Figure 1:
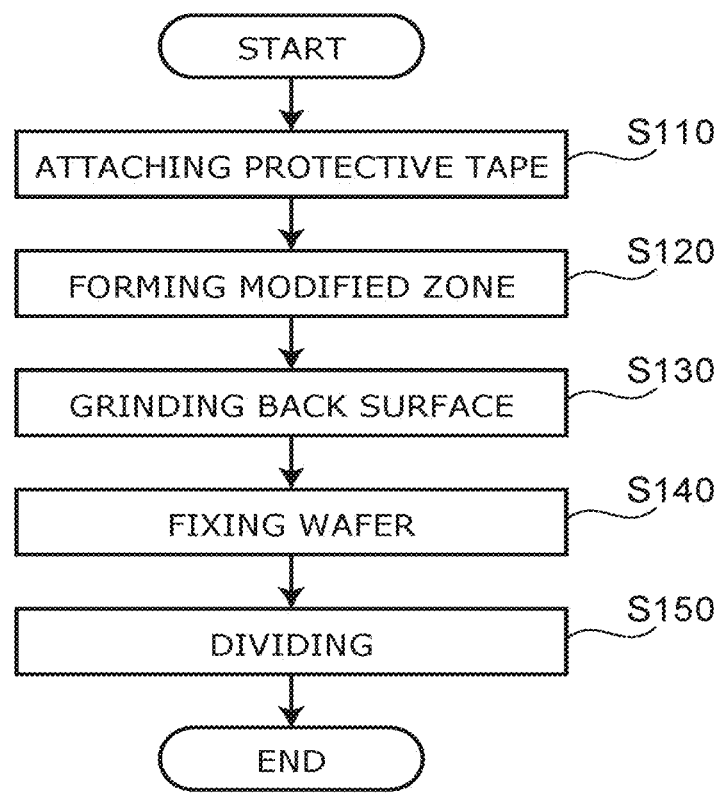
FIG. 1 is a flowchart showing a method of manufacturing a semiconductor device according to a first embodiment.

According to an embodiment, a method of manufacturing a semiconductor device includes forming a first modified zone in a wafer by irradiating the wafer with a laser having transmissivity with respect to the wafer along a part of a dicing line on the wafer, and forming a second modified zone in the wafer by irradiating the wafer with the laser along the dicing line on the wafer. The first modified zone is partially formed between a surface of the wafer and the second modified zone, a semiconductor interconnect layer being formed on the surface of the wafer.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

(First Embodiment)

FIG. 1 is a flowchart showing a method of manufacturing a semiconductor device according to a first embodiment.

In the method of manufacturing the semiconductor device of the embodiment, the wafer is fragmented into a plurality of semiconductor elements by dicing a wafer along dicing lines.

First, a laser dicing technique will be described in brief as a dicing technique for fragmenting the wafer into a plurality of semiconductor elements.

As shown in FIG. 1, first, a protective tape is attached on a surface of the wafer (S110). For example, a semiconductor interconnect layer is provided on the surface of the wafer.

Next, the laser is irradiated from the back surface of the wafer, and the laser is condensed inside the silicon to form a modified zone (S120). As the modified zone expands, cracks proceed up and down, and half cuts are formed on the surface of the wafer. The laser is, for example, a transmission laser in the infrared region.

Next, the back surface of the wafer is ground with a grinding stone to be processed thinly (S130). When it is thinly ground, the half cut part is exposed, and the chip is fragmented.

Next, the tape is attached to the back surface of the wafer with an adhesive, and the periphery of the wafer is fixed with a support (S140). Here, the adhesive is, for example, a DAF (Die Attach Film). The tape is constituted, for example, of a base material and a sticking agent, The support is, for example, a ring for fixing the periphery of the wafer.

Next, the tape and the wafer are pushed up from the bottom with a pressing body (S150). Accordingly, the distance between the chips is widened and the adhesive part is divided, Here, the pressing body is, for example, an expansion ring.

By the dicing process shown in S110 to S150, the wafer is fragmented into a plurality of semiconductor elements.

Hereinafter, a process of additionally forming a modified zone at the corner of the wafer in the dicing process will be described.

FIGS. 2 to 6 are perspective views showing a dicing process in the method of manufacturing the semiconductor device according to the first embodiment.

Figure 7:
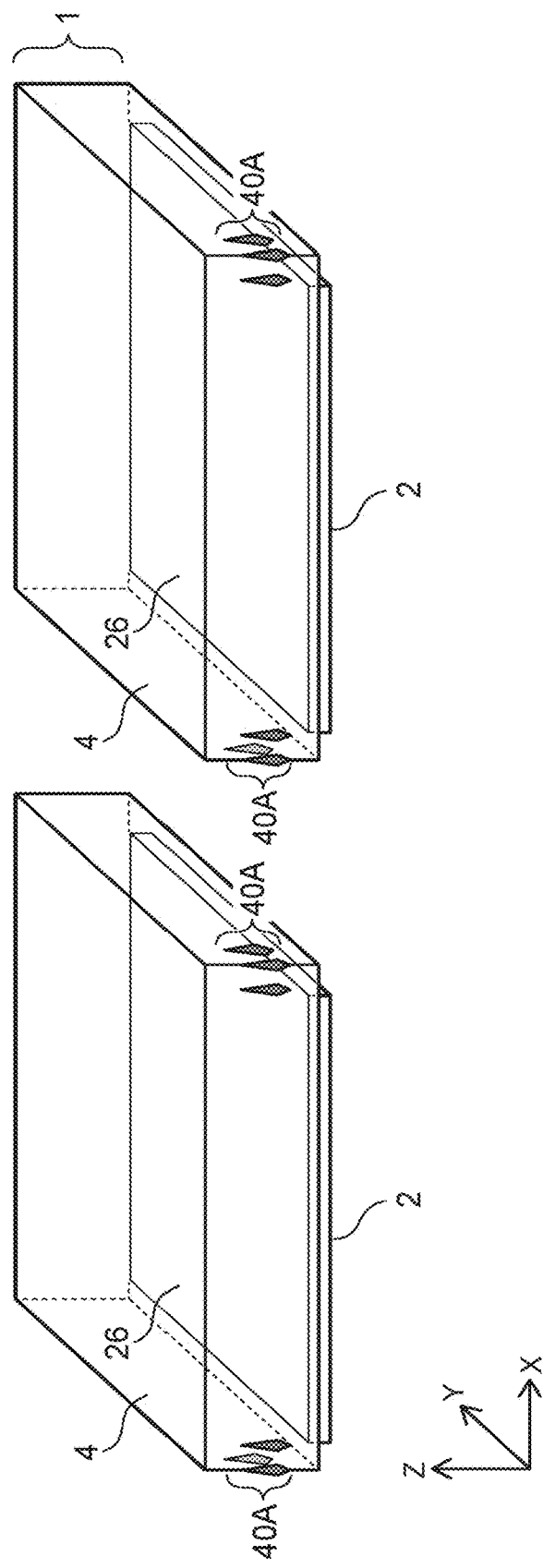
FIG. 7 is a perspective view showing a semiconductor element after the dicing process.

FIG. 7 is a perspective view showing the semiconductor element after the dicing process.

FIGS. 2 to 7 are perspective views showing a form in which a wafer 4 is subjected to dicing with the laser dicing technique to be fragmented into a plurality of semiconductor elements 1.

In the specification, two directions parallel to the surface of the wafer 4 and orthogonal to each other are defined as an X-direction and a Y-direction. A direction orthogonal to both the X-direction and the Y direction is defined as a Z-direction.

Figure 2:
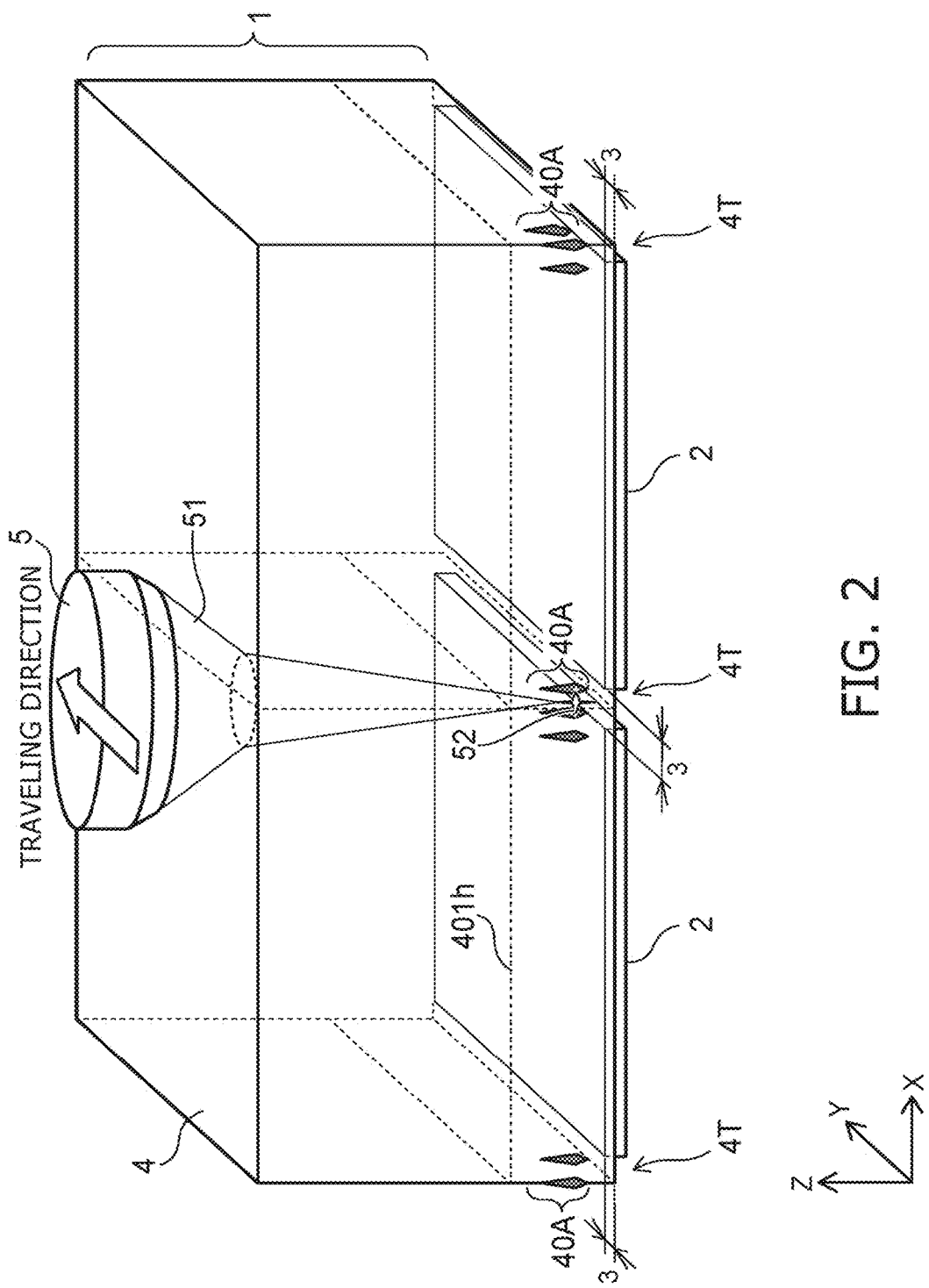
FIG. 2 is a perspective view showing a dicing process in the method of manufacturing the semiconductor device according to the first embodiment.

First, as shown in FIG. 2, a corner modified zone 40A formed by irradiating corners 4T of the wafer 4 of the semiconductor element 1 with a laser. Here, the corners 4T of the wafer 4 correspond to the corners of the wafer 4 which have been fragmented into after dicing.

The corner modified zone 40A is formed such that the focal point 52 is aligned to the position between the modified zone 401 as the division starting point and the semiconductor interconnect layer 2 and a transmission beam 51 is irradiated from a beam head 5. The corner modified zone 40A is formed inside the wafer 4 just above the isolation zone 3. For example, the corner modified zone 40A is formed by aligning the focal point 52 based on a position 401h. Here, the position 401h corresponds to a position in the Z-direction of the lower end of the modified zone 401 as the division starting point.

Figure 3:
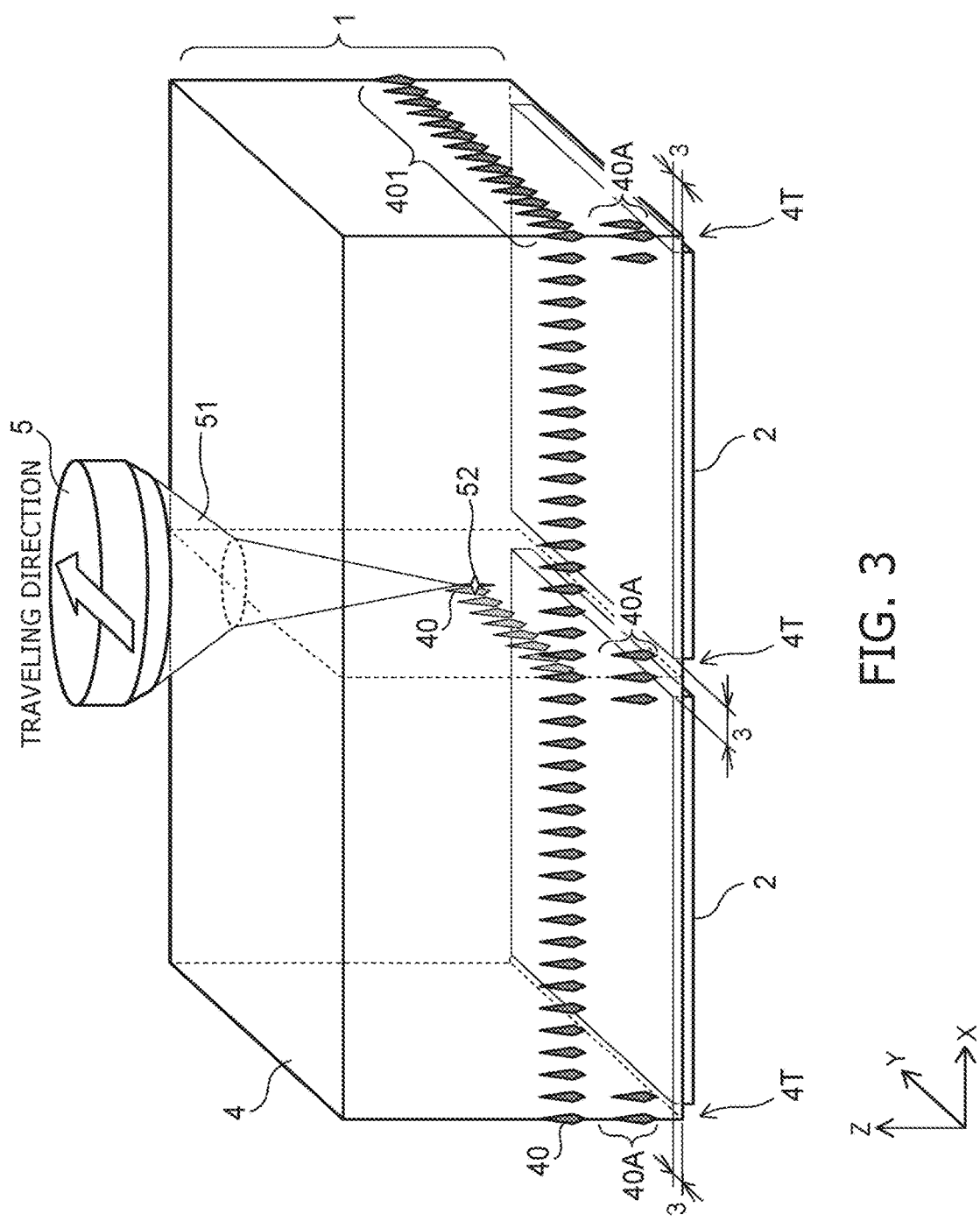
FIG. 3 is a perspective view showing a dicing process in the method of manufacturing the semiconductor device according to the first embodiment.

As shown in FIG. 3, the focal point 52 is aligned to a position away in the Z-direction from the corner modified zone 40A formed inside the wafer 4, thereby forming modified marks 40 along the isolation zone 3 by irradiation of the transmission beam 51 from the beam head 5. When the modified marks 40 are continuously formed in a traveling direction (Y-direction) of the beam head 5, the modified zone 401 is formed as the division starting point.

Figure 4:
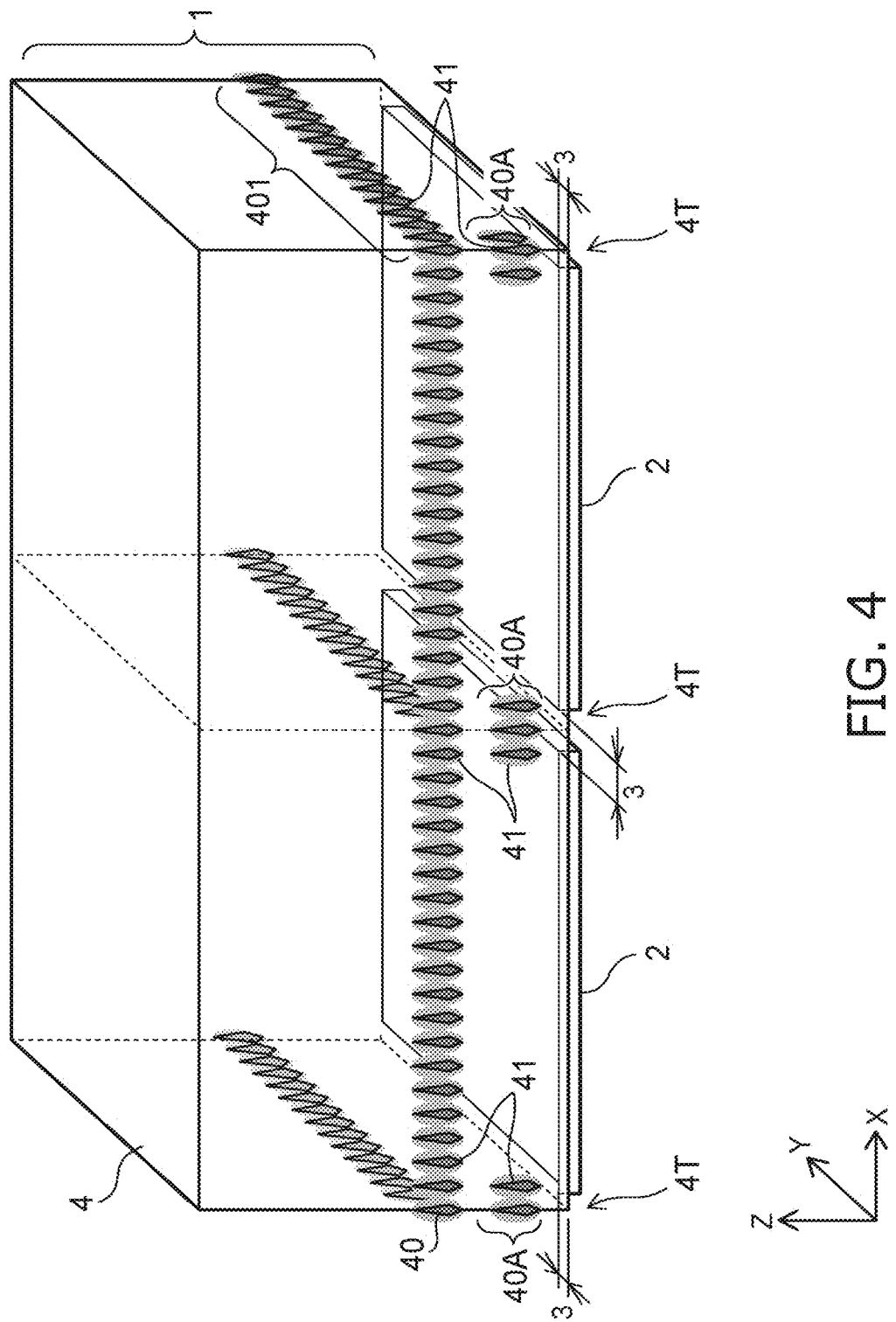
FIG. 4 is a perspective view showing a dicing process in the method of manufacturing the semiconductor device according to the first embodiment.

Next, as shown in FIG. 4, the corner modified zones 40A located at the corners 4T and the modified zones 401 serving as the division starting points along the isolation zone 3 are formed inside the wafer 4.

Here, the process shown in FIGS. 2 to 4 corresponds to the modified zone forming process (S120) in FIG. 1.

Figure 5:
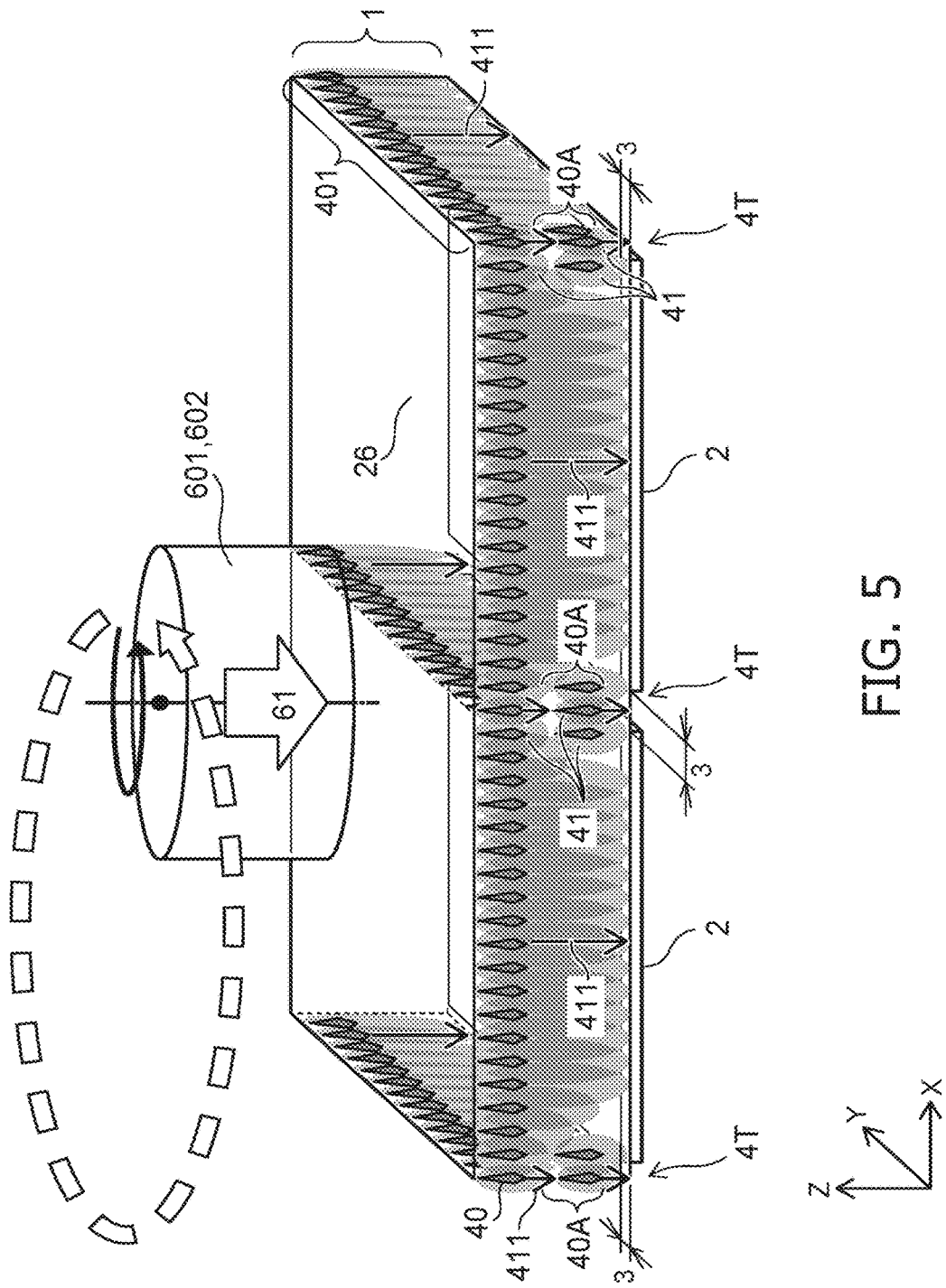
FIG. 5 is a perspective view showing a dicing process in the method of manufacturing the semiconductor device according to the first embodiment.

Next, as shown in FIG. 5, as grinding by a grinding stone 601 (in some cases, polishing by the buff 602) proceeds, a straight cleavage 41 extends in a vertical direction (−Z-direction). Since a load 61 is transmitted on a side edge of the semiconductor element 1 as indicated by an arrow, a cleavage direction 411 of the straight cleavage 41 tends to extend in the vertical direction. On the other hand, at the corner of the semiconductor element 1, since the corner modified zone 40A is formed just below the modified zone 401 as the division starting point, the straight cleavage 41 is continuous to the corner modified zone 40A from the modified zone 401 as the division starting point.

In addition, the straight cleavage 41 extends in the vertical direction from the corner modified zone 40A, whereby the wafer at the corner of the semiconductor element 1 is cleaved.

Figure 6:
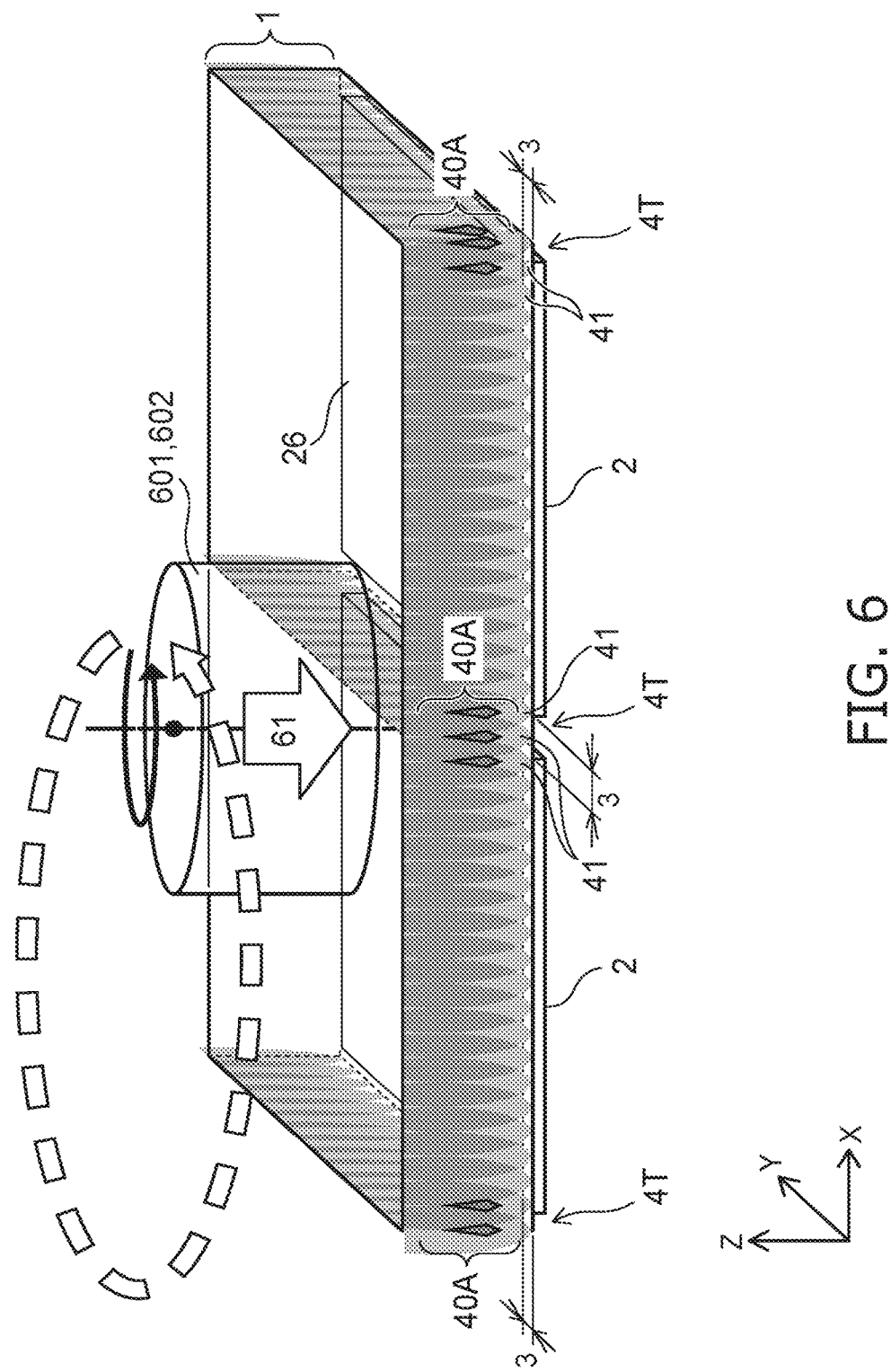
FIG. 6 is a perspective view showing a dicing process in the method of manufacturing the semiconductor device according to the first embodiment.

As shown in FIG. 6, grinding (or polishing) proceeds, and the entire surface of the wafer 4 on the side surface of the semiconductor element 1 is cleaved along the isolation zone 3.

Here, the process shown in FIGS. 5 and 6 corresponds to the back surface grinding process (S130) in FIG. 1.

Thereafter, the wafer fixing process (S140) and dividing process (S150) in FIG. 1 are performed to fragment the wafer into a plurality of semiconductor elements 1 as shown in FIG. 7. In the semiconductor element 1 after the dicing process, the modified mark 40, that is, the corner modified zone 40A may remain at the corner on the side surface of the wafer 4.

Hereinafter, the modified zone 40A and the modified zone 401 as the division starting point will be described in detail.

Figure 8A:
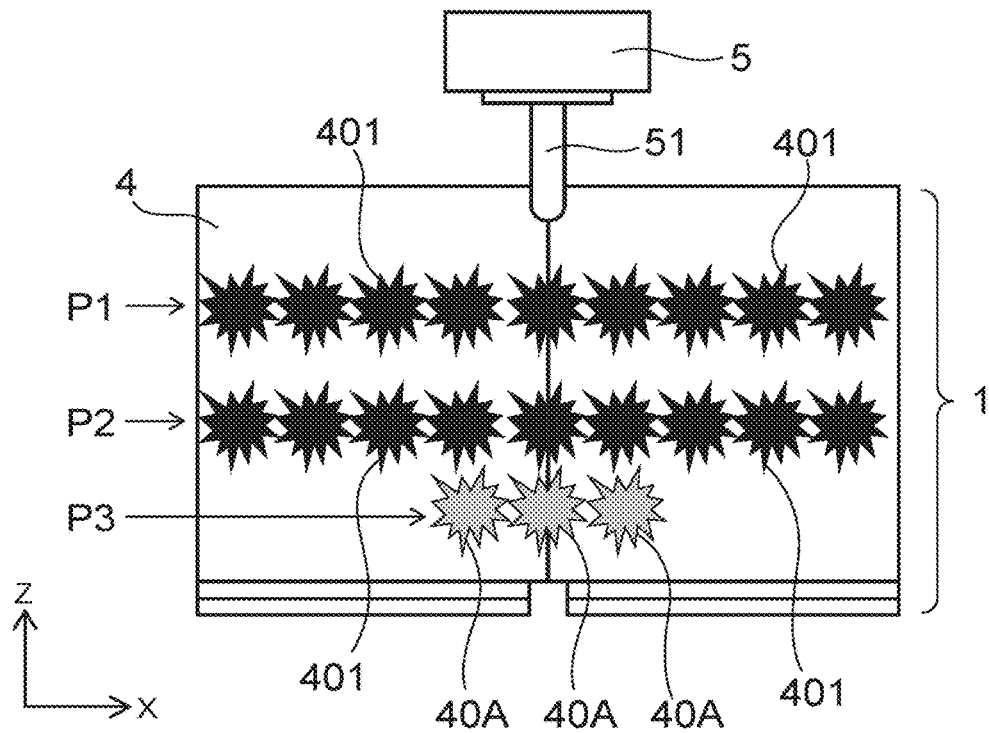
FIGS. 8A and 8B are views for describing path formation positions.
Figure 8B:
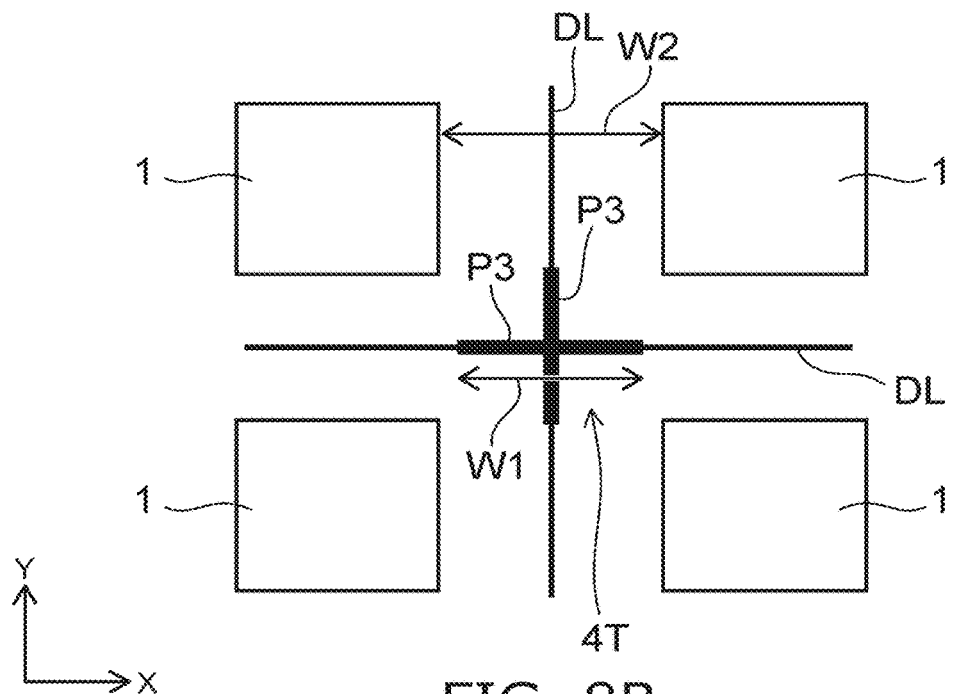

FIGS. 8A and 8B are views for describing path formation positions.

FIGS. 8A and 8B are views showing formation positions of the modified zone 401 as the division starting point and the modified zone 40A, and show an X-Z section and an X-Y plane of the wafer 4 respectively.

As shown in FIGS. 8A and 8B, the modified zone 401 as the division starting point is formed along a dicing line DL. For example, the modified zone 401 as the division starting point is formed continuously in the traveling direction of the beam head 5. Two paths P1 and P2 parallel to the Z-direction are formed by the modified zone 401 as the division starting point.

The corner modified zone 40A is formed at the corner 4T on the dicing line DL. A path P3 is formed by the plurality of corner modified zones 40A. As shown in FIG. 8B, for example, a width W1 of the path P3 in the X-direction is 50 micrometers. For example, the half value of the width W1 is almost same as the half value of a width W2 of a region (dicing street) provided between the semiconductor elements 1. Here, the region provided between the semiconductor elements 1 corresponds to the isolation zone (isolation zone 3).

In the example of FIGS. 8A and 8B, the path P3 is formed in a cross shape at the corner 4T on the dicing line DL, the formation position and the shape of the path P3 is arbitrary. That is, the path P3 can be formed partially in a linear shape on the dicing line DL.

The path P3 (that is, the plurality of corner modified zones 40A) suppresses occurrence of skewed cracks in the back surface grinding process (S130). When the path P3 is formed at the corner 4T on the dicing line DL, the occurrence of skewed cracks is suppressed at the corner 4T. The path P3 is a crack suppressing path.

Hereinafter, effects of the embodiment will be described.

Figure 9B:
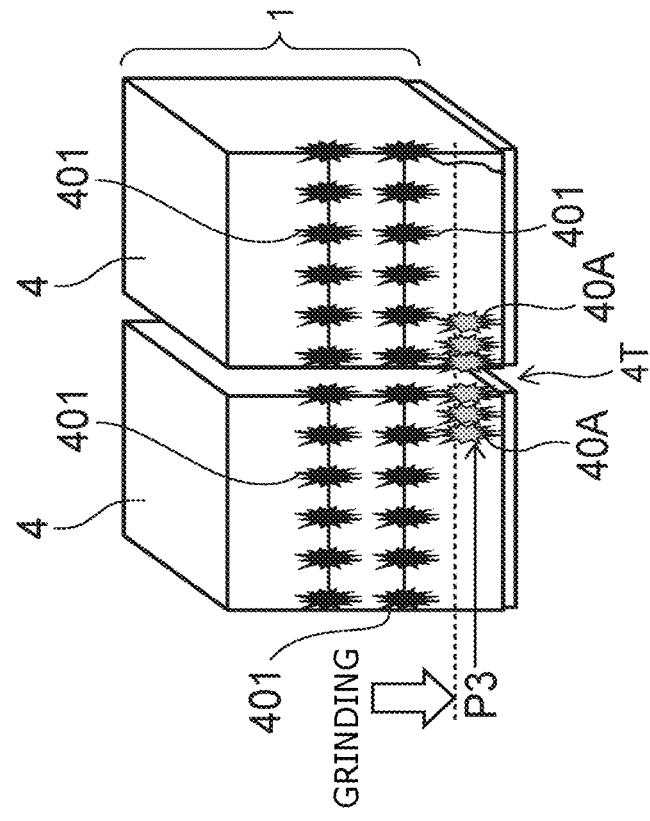
FIG. 9B is a view showing a state of the back surface grinding process when the crack suppressing path is formed.
Figure 9B:
Figure 9A:
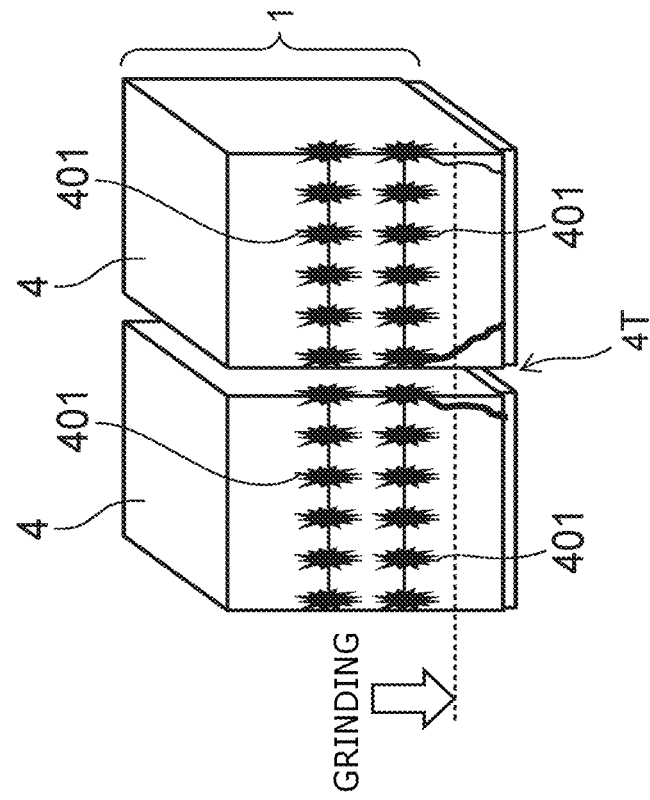
FIG. 9A is a view showing a state of a back surface grinding process when a crack suppressing path is not formed.
Figure 9A:

FIG. 9A is a view showing a state of the back surface grinding process when the crack suppressing path is not formed, and FIG. 9B is a view showing a state of the back surface grinding process when the crack suppressing path is formed.

In the laser dicing technique, the laser is condensed inside the wafer along the outer shape of the semiconductor element to form a modified zone and a cleavage surface due to thermal expansion on the side surface of the semiconductor element, and then the wafer is divided and fragmented by grinding the wafer from the back surface. As shown in FIG. 9A, in the back surface grinding process, skewed cracks easily occur from the corner 4T of the semiconductor element 1. As the skewed cracks expand from the corner 4T, cracks extend in every direction in some cases. Therefore, there is concern that the semiconductor interconnect layer 2 is damaged and thus the semiconductor element 1 is damaged.

In the embodiment, the corner modified zone 40A is formed at the corner 4T on the dicing line DL between the modified zone 401 as the division starting point and the semiconductor interconnect layer 2. As a result, cleavage is promoted in the vertical direction (−Z-direction), and occurrence of skewed cracks can be suppressed. As shown in FIG. 9B, since the path (path P3) for suppressing the skewed cracks is formed, expansion of the skewed cracks from the corner is suppressed and thus the occurrence of cracks is suppressed. As a result, damage of the semiconductor interconnect layer 2 is suppressed, and thus damage of the semiconductor element 1 is suppressed.

According to the embodiment, it is possible to provide the semiconductor device and the method of manufacturing the same in which occurrence of cracks is suppressed.

Second Embodiment

FIGS. 10 to 14 are perspective views showing a dicing process in a method of manufacturing a semiconductor device according to a second embodiment.

Figure 15:
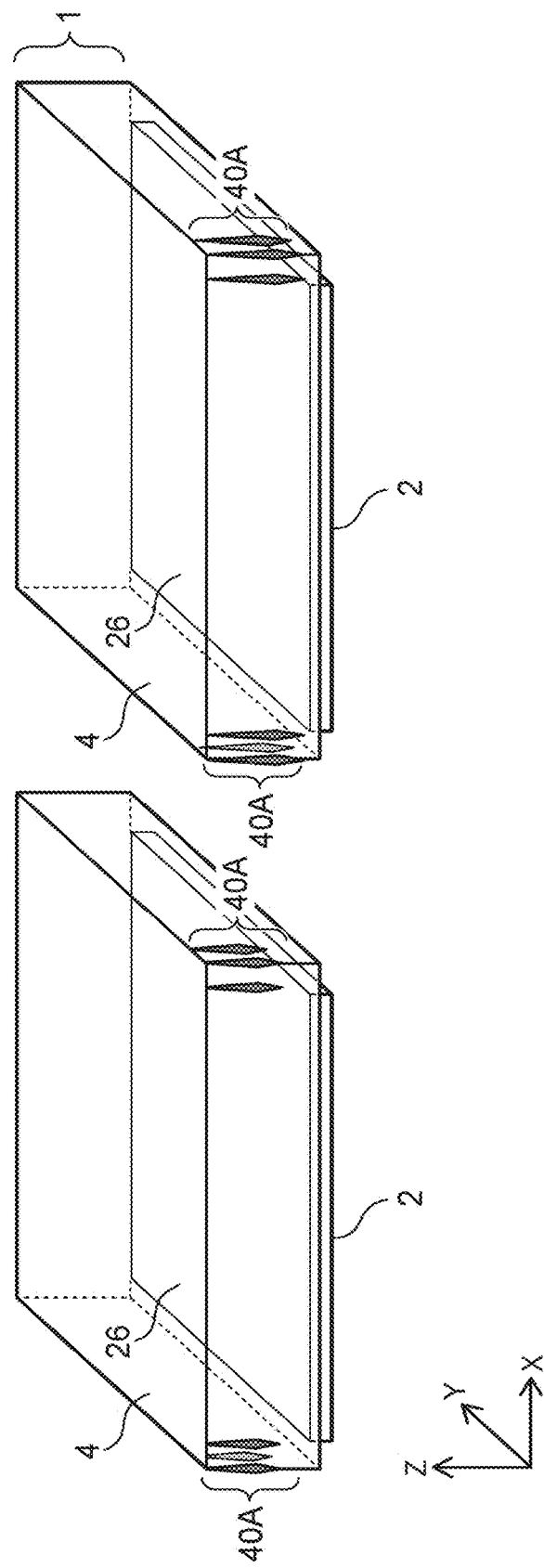
FIG. 15 is a perspective view showing a semiconductor element after the dicing process.

FIG. 15 is a perspective view showing a semiconductor device after the dicing process.

FIGS. 10 to 15 are perspective views showing forms in which a wafer 4 is subjected to dicing with a laser dicing technique to be fragmented into a plurality of semiconductor elements 1.

Figure 10:
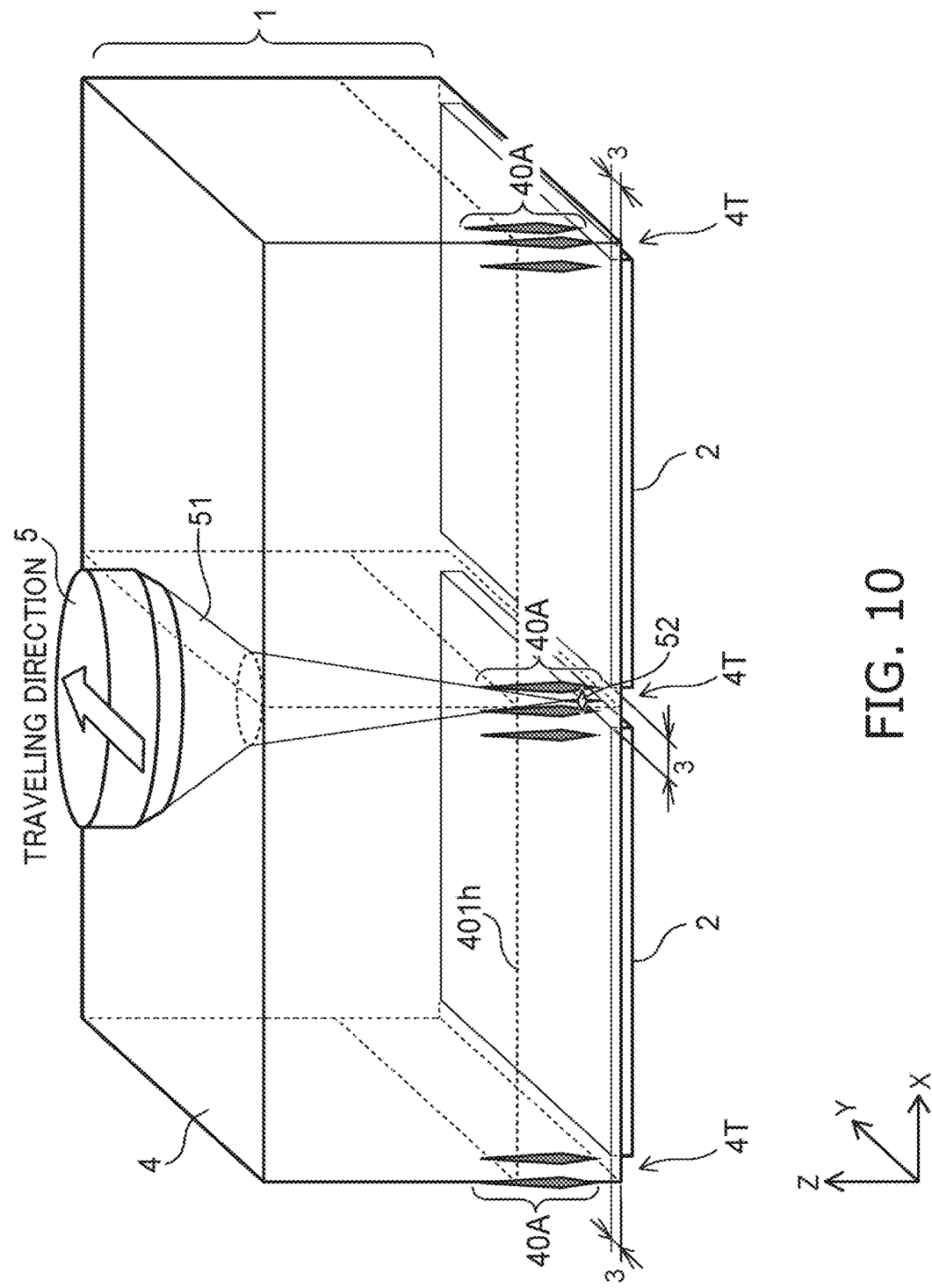
FIG. 10 is a perspective view showing a dicing process in a method of manufacturing a semiconductor device according to a second embodiment.

First, as shown in FIG. 10, corners 4T of the wafer 4 of the semiconductor element 1 are irradiated with a laser to form corner modified zones 40A. The corner modified zone 40A is formed such that a focal point 52 is aligned to a position closer to a semiconductor interconnect layer 2 than a position 401h and the energy of a transmission beam 51 is made larger than that in the first embodiment to irradiate the transmission beam 51 from a beam head 5. The corner modified zone 40A is formed inside the wafer 4 just above an isolation zone 3 so that a width in a Z-direction of the corner modified zone 40A becomes larger beyond the position 401h.

Figure 11:
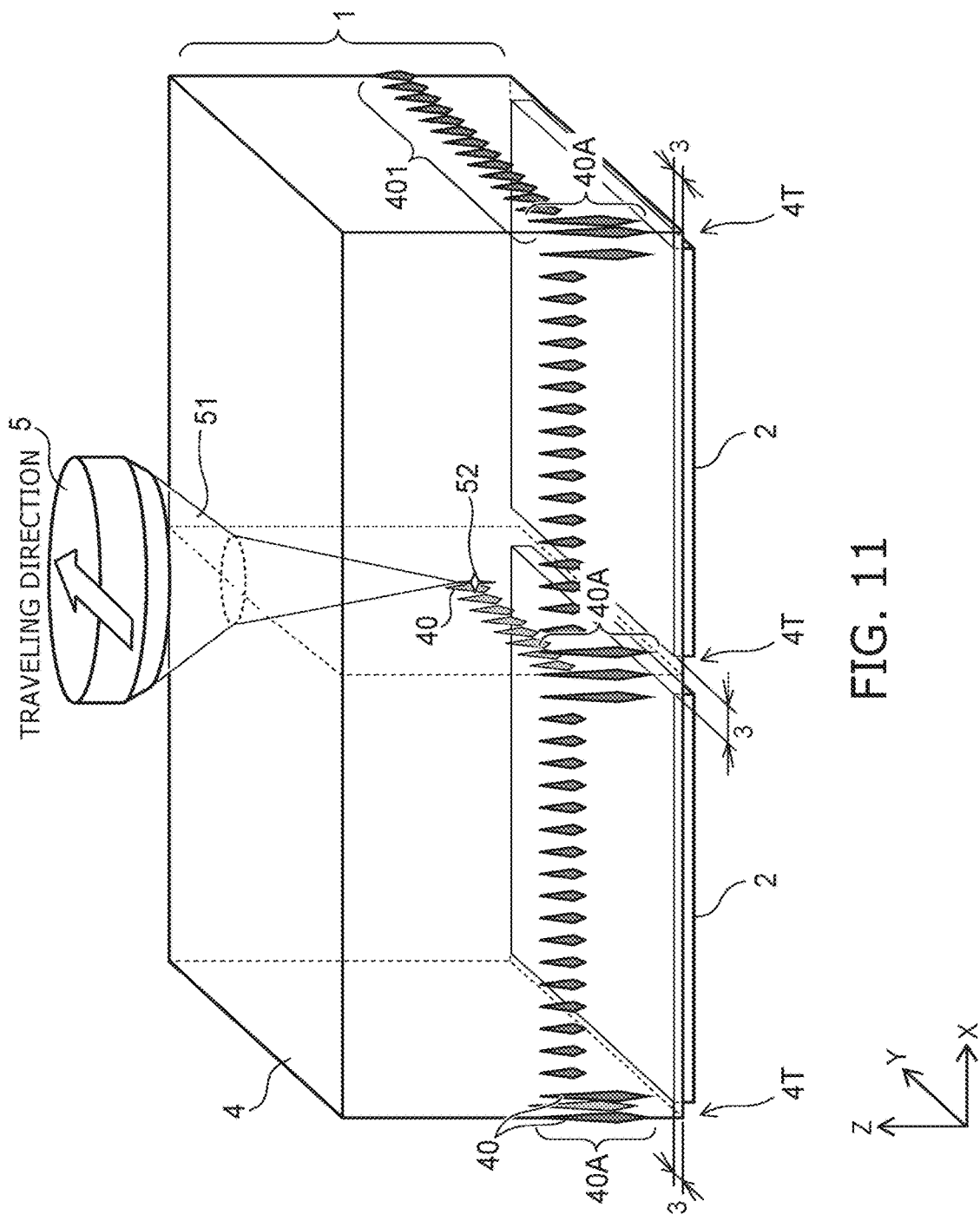
FIG. 11 is a perspective view showing a dicing process in the method of manufacturing the semiconductor device according to the second embodiment.

Next, as shown in FIG. 11, the focal point 52 is aligned to avoid the corner modified zone 40A formed inside the wafer 4, thereby forming modified marks 40 along the isolation zone 3 by irradiation of the transmission beam 51 from the beam head 5. When the modified marks 40 are continuously formed in a traveling direction (Y-direction) of the beam head 5, a modified zone 401 as a division starting point is formed.

Figure 12:
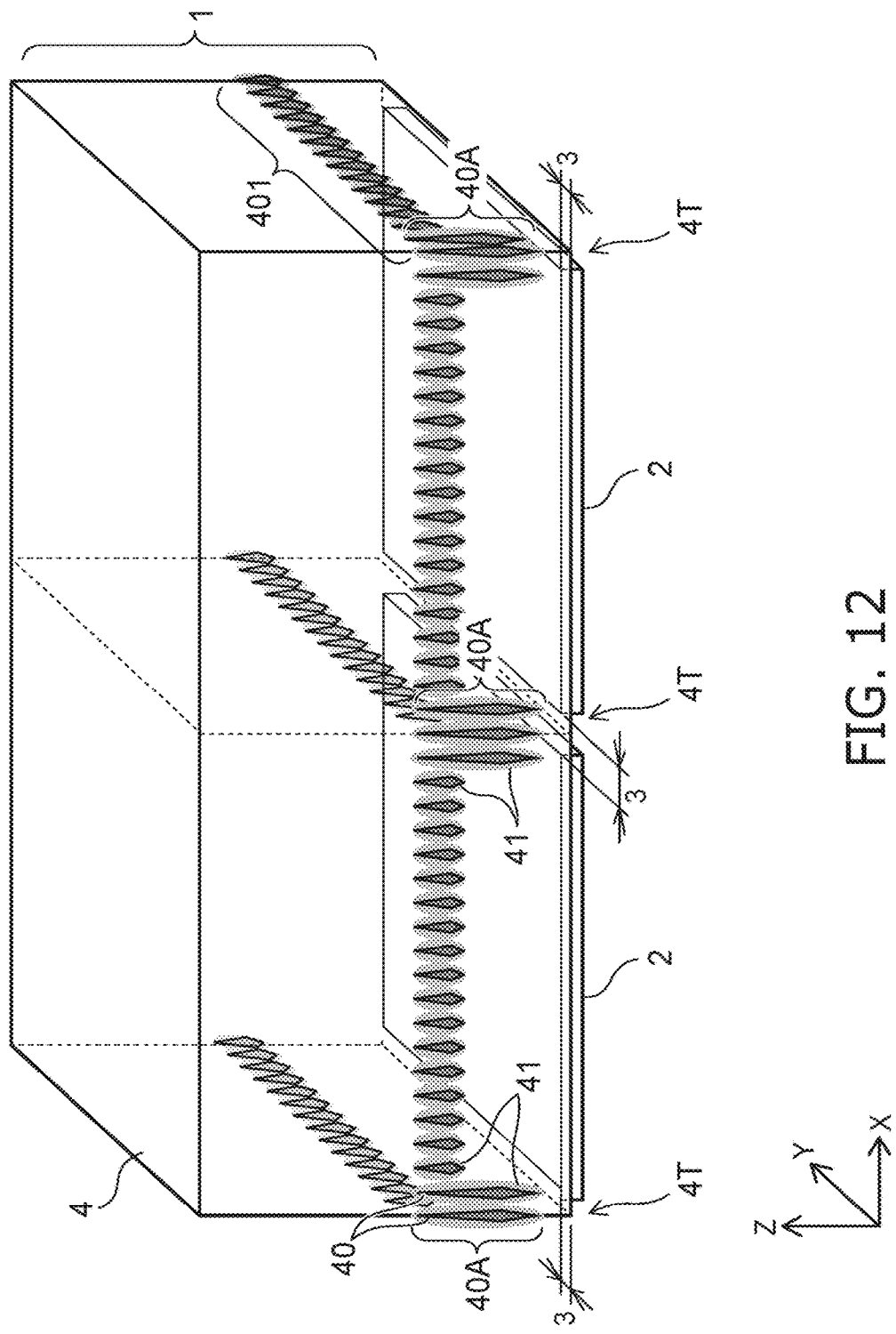
FIG. 12 is a perspective view showing a dicing process in the method of manufacturing the semiconductor device according to the second embodiment.

Next, as shown in FIG. 12, the corner modified zones 40A located at the corners 4T and the modified zones 401 serving as the division starting points along the isolation zone 3 are formed inside the wafer 4.

Figure 13:
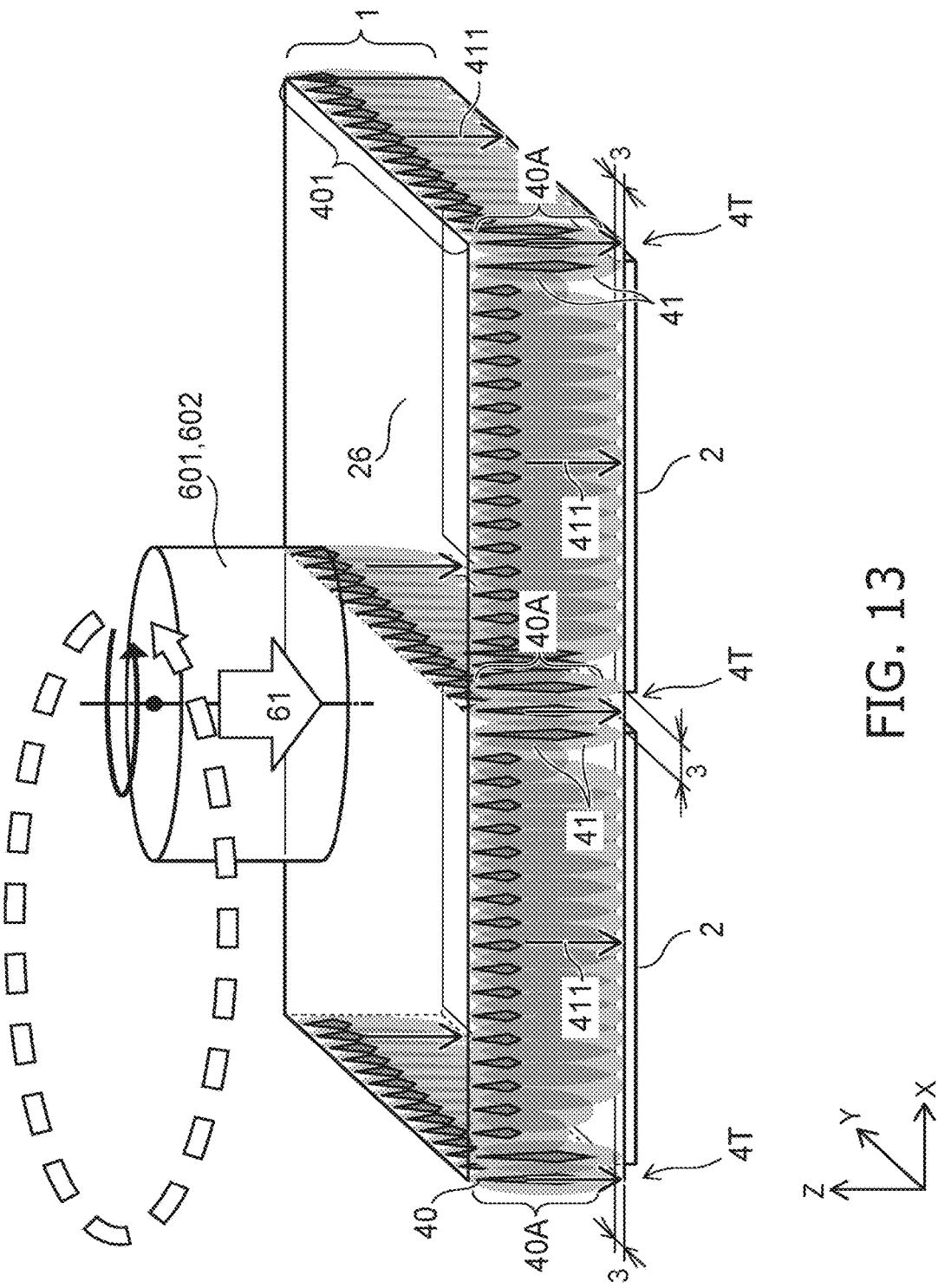
FIG. 13 is a perspective view showing a dicing process in the method of manufacturing the semiconductor device according to the second embodiment.

Here, the process shown in FIGS. 10 to 12 corresponds to the modified zone forming process (S120) in FIG. 1. Subsequently, as shown in FIG. 13, as grinding with a grinding stone 601 (in some cases, polishing by a buffer 602) proceeds, a straight cleavage 41 extends in a vertical direction (−Z-direction). Since a side edge of the semiconductor element 1 has already been cleaved in four directions, as indicated by an arrow, propagation of a load 61 to a position directly under the straight cleavage 41 is weakened. On the other hand, since the corner modified zone 40A is formed lower than the modified zone 401 as the division starting point, the straight cleavage 41 easily extends in the vertical direction to reach the isolation zone 3 on a side of the semiconductor interconnect layer 2 from the corner modified zone 40A. Then, since a width in the Z-direction of the corner modified zone 40A is large, the straight cleavage 41 is continuous in a plane direction (X-direction and Y-direction) between the modified zone 401 as the division starting point and the corner modified zone 40A.

Figure 14:
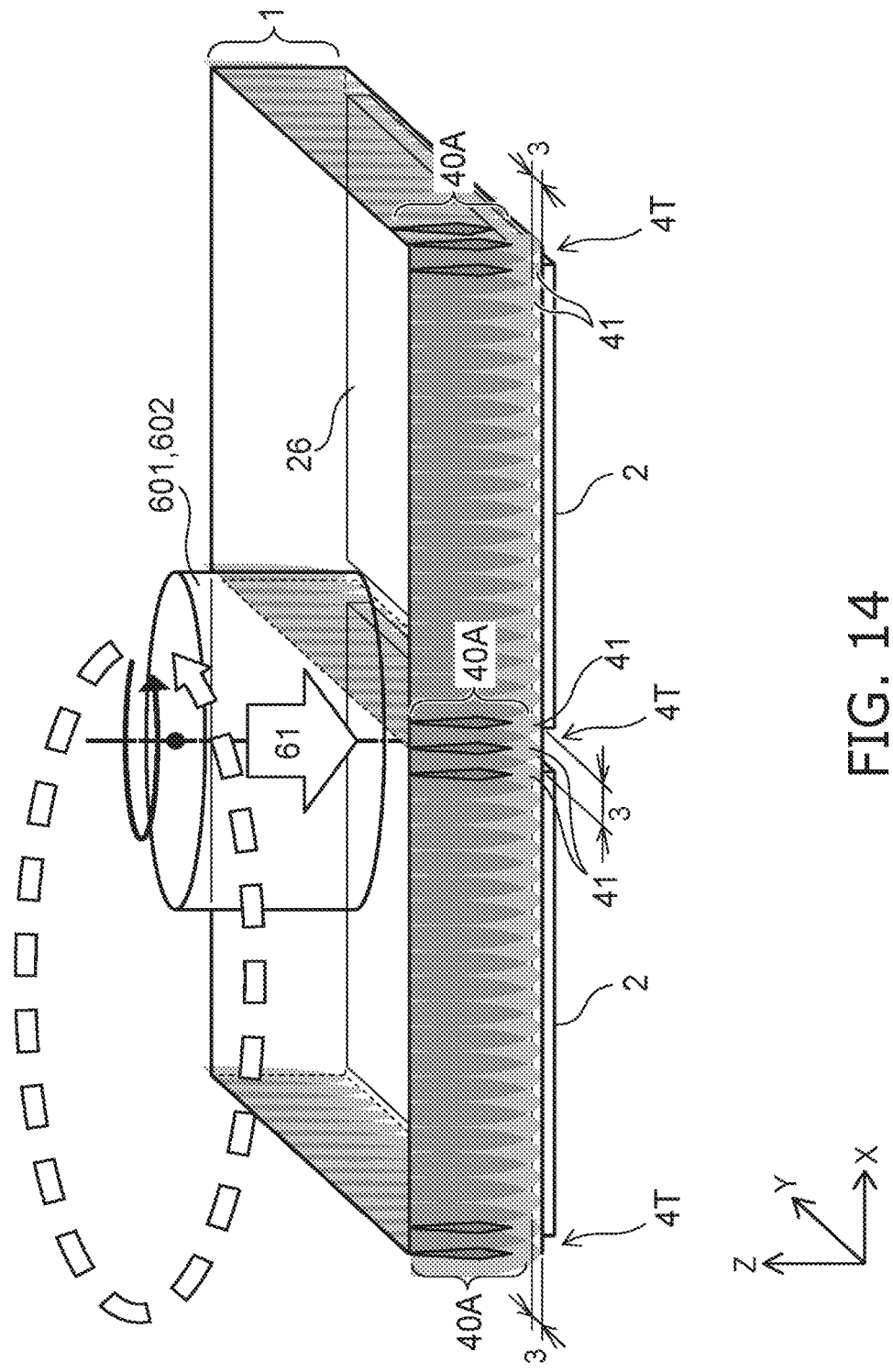
FIG. 14 is a perspective view showing a dicing process in the method of manufacturing the semiconductor device according to the second embodiment.

Next, as shown in FIG. 14, grinding (or polishing) proceeds, and the entire surface of the wafer 4 on the side surface of the semiconductor element 1 is cleaved along the isolation zone 3.

Here, the process shown in FIGS. 13 and 14 correspond to the back surface grinding process (S130) in FIG. 1.

Thereafter, the wafer fixing process (S140) and dividing process (S150) in FIG. 1 are performed to fragment the wafer into a plurality of semiconductor elements 1 as shown in FIG. 15. In the semiconductor element 1 after the dicing process, the modified mark 40 from a grinding surface 26, that is, the corner modified zone 40A may remain at the corner on the side surface of the wafer 4.

The embodiment has the same effect as in the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A method of manufacturing a semiconductor device comprising:
    forming a first modified zone in a wafer by irradiating the wafer with a laser having transmissivity with respect to the wafer along a part of a dicing line on the wafer; and
    forming a second modified zone in the wafer by irradiating the wafer with the laser along the dicing line on the wafer,
    the first modified zone being partially formed between a surface of the wafer and the second modified zone, a semiconductor interconnect layer being formed on the surface of the wafer,
    wherein the first modified zone is formed by irradiating the wafer with the laser in a crossing manner along a part of each of a plurality of dicing lines on the wafer.

2. The method according to claim 1, further comprising:
    grinding the wafer from a back surface of the wafer positioned opposite to the surface of the wafer on which the semiconductor interconnect layer is formed, after the forming of the second modified zone.

3. The method according to claim 2, further comprising:
    attaching a tape to the back surface of the wafer and fixing a periphery of the wafer by a support, after the grinding of the wafer; and
    pushing up the tape and the wafer by a pressing body.

4. The method according to claim 1, wherein
    the first modified zone is formed linearly along the surface of the wafer, and
    a width of the first modified zone is substantially same as a width of an isolation zone in which the dicing line is formed.

5. A method of manufacturing a semiconductor device comprising:

forming a corner modified zone by irradiating an intersecting portion of dicing lines with a laser having transmissivity with respect to a wafer in a semiconductor element; and forming a modified zone by irradiating a portion except for the intersecting portion with the laser along the dicing lines.

6. The method according to claim 5, wherein in the forming of the corner modified zone and the modified zone, the laser is irradiated from a back surface of the wafer positioned opposite to a surface of the wafer on which a semiconductor interconnect layer is formed.

7. The method according to claim 5, further comprising:

grinding the wafer from a back surface of the wafer positioned opposite to a surface of the wafer on which a semiconductor interconnect layer is formed, after the forming of the modified zone.

8. The method according to claim 7, further comprising:

attaching a tape to the back surface of the wafer and fixing a periphery of the wafer by a support, after the grinding of the wafer; and pushing up the tape and the wafer by a pressing body.

9. The method according to claim 5, wherein the corner modified zone is formed linearly along a surface of the wafer, and a width of the corner modified zone is substantially same as a width of an isolation zone in which the dicing lines are formed.

10. A method of manufacturing a semiconductor device comprising:

forming a first path including a plurality of first modified zones in a wafer by irradiating the wafer with a laser having transmissivity with respect to the wafer along a part of a dicing line on the wafer; and forming a second path including a plurality of second modified zones in the wafer by irradiating the wafer with the laser along the dicing line on the wafer, the first path being partially formed between a surface of the wafer and the second path, a semiconductor interconnect layer being formed on the surface of the wafer, wherein the first path is formed by irradiating the wafer with the laser in a crossing manner along a part of each of a plurality of dicing lines on the wafer.

11. The method according to claim 10, further comprising:

grinding the wafer from a back surface of the wafer positioned opposite to the surface of the wafer on which the semiconductor interconnect layer is formed, after the forming of the second path.

12. The method according to claim 11, further comprising:

attaching a tape to the back surface of the wafer and fixing a periphery of the wafer by a support, after the grinding of the wafer; and pushing up the tape and the wafer by a pressing body.

13. The method according to claim 10, wherein the first path is formed linearly along the surface of the wafer, and a width of the first path is substantially same as a width of an isolation zone in which the dicing line is formed.

* * * * *